(12) United States Patent
Ko (10) Patent No.: US 8,248,863 B2
(45) Date of Patent: Aug. 21, 2012

(54) DATA BUFFER CONTROL CIRCUIT AND SEMICONDUCTOR MEMORY APPARATUS INCLUDING THE SAME

(75) Inventor: Bok Rim Ko, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 332 days.

(21) Appl. No.: 12/647,795

(22) Filed: Dec. 28, 2009

(65) Prior Publication Data

US 2010/0329039 A1   Dec. 30, 2010

(30) Foreign Application Priority Data

Jun. 26, 2009   (KR) .................. 10-2009-0057626

(51) Int. Cl.
*G11C 16/04*   (2006.01)
(52) U.S. Cl. ............ 365/189.05; 365/194; 365/233.1
(58) Field of Classification Search ......... 365/189.05, 365/194, 233.1, 189.16
See application file for complete search history.

(56) References Cited

U.S. PATENT DOCUMENTS

| | | | |
|---|---|---|---|
| 6,292,420 B1 * | 9/2001 | Kim et al. ................ | 365/185.05 |
| 6,944,091 B2 * | 9/2005 | Lee et al. ................ | 365/189.05 |
| 7,511,538 B2 | 3/2009 | Kang et al. | |

FOREIGN PATENT DOCUMENTS

| | | |
|---|---|---|
| KR | 1020020048539 A | 6/2002 |
| KR | 1020080014544 A | 2/2008 |
| KR | 1020080108866 A | 12/2008 |

* cited by examiner

*Primary Examiner* — David Lam
(74) *Attorney, Agent, or Firm* — Ladas & Parry LLP (57) ABSTRACT

A data buffer control circuit and a semiconductor memory apparatus including the same are presented. The data buffer control circuit may include an internal command signal generator and a buffer enable signal generator. The internal command signal generator is configured to generate an internal command signal that is activated if delayed command signals are conditioned in a predetermined state of level combination. The buffer enable signal generator is configured to generate a buffer enable signal, which enables a data buffer receiving data in a writing mode, from the internal command signal in sync with a falling edge of an internal clock signal.

12 Claims, 6 Drawing Sheets

DATA BUFFER CONTROL CIRCUIT AND SEMICONDUCTOR MEMORY APPARATUS INCLUDING THE SAME

CROSS-REFERENCES TO RELATED PATENT APPLICATION

The present application claims priority under 35 U.S.C 119(a) to Korean Application No. 10-2009-0057626, filed on Jun. 26, 2009, in the Korean Intellectual Property Office, which is incorporated herein by reference in its entirety as set forth in full.

BACKGROUND

This disclosure relates to data buffer control circuit for semiconductor memory apparatuses.

Semiconductor memories have been continuously evolving toward higher and higher integration densities and ever increasingly swifter data rates for the purpose of enhancing systemic performance. The requirement for higher data rate of semiconductor memories has contributed to the great advancement of synchronous dynamic random access memories (synchronous DRAMs) that are operable in sync with system clocks.

Traditional synchronous DRAMs had a limit to enlarging a bandwidth between themselves and DRAM controllers, i.e., an amount of data input/output per unit time, because data input/output could be conducted in one clock cycle of a system clock. In recent years, dual-data-rate (DDR) synchronous DRAMs (DDR SDRAMs) have been developed to more enhance data rates, in which data are input/output in sync with both raising and falling edges of system clocks. The DDR SDRAMs are usually employing data strobe signals in order to reduce timing margin loss by a timing skew between them, access time gaps by variations of process, voltage and temperature (PVT variation), and differences of propagation delays between memory controllers and memory modules.

In the meantime, a parameter tQSS is defined in a DDR SDRAM for the purpose of assuring a reliable writing operation. The tQSS means a delay time from a rising edge of a system clock (tCK) at which a write command is input into the DDR SDRAM until a first rising edge of the data strobe signal. In the standard specification, the minimum clock cycle time of tQSS is defined in 0.75tCK and the maximum clock cycle time is defined in 1.25tCK. Therefore, the DDR SDRAM must normally complete a data writing operation in the minimum time of 0.75tCK or in the maximum time 1.25tCK.

Figure 1:
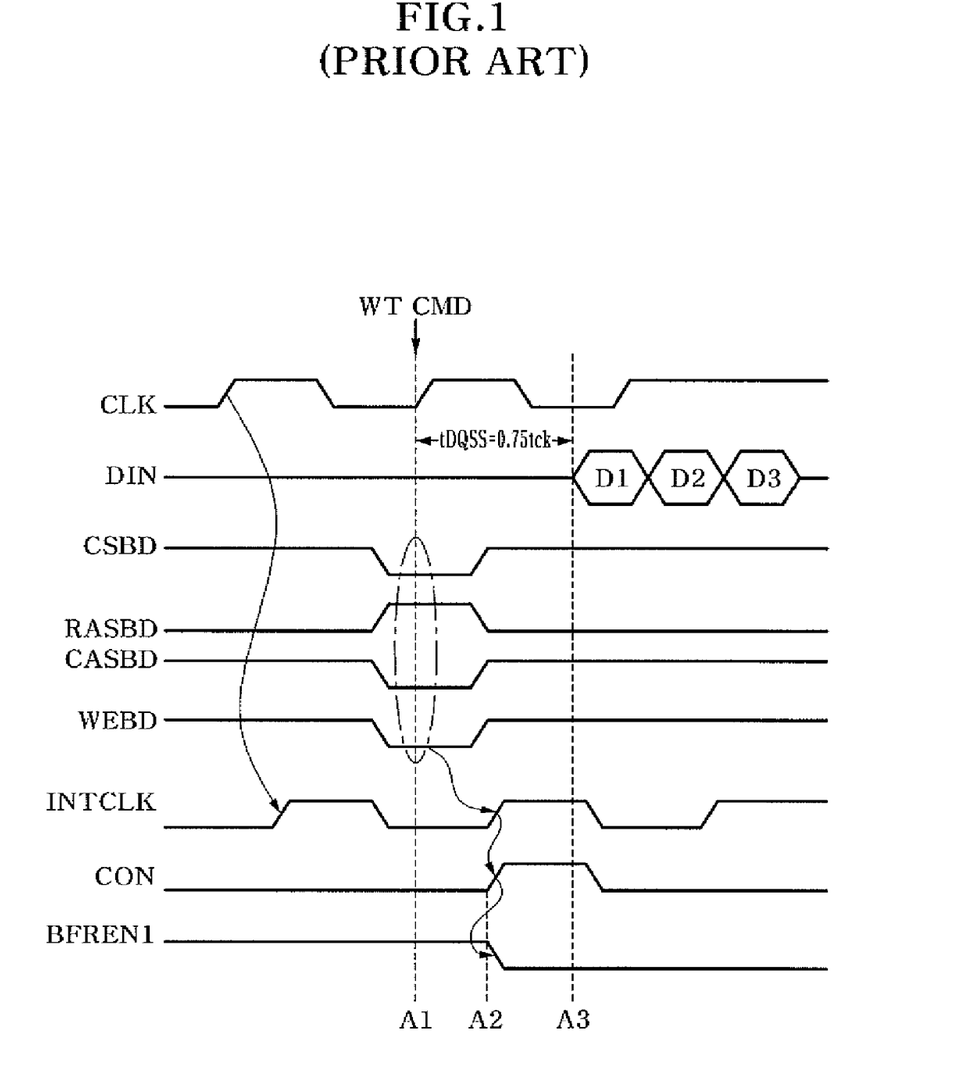
FIG. 1 is a timing diagram showing a general data buffer control operation.

FIG. 1 shows a general process of data buffer control operation. The data buffer control operation shown in FIG. 1 is for generating a buffer enable signal to enable a data buffer into which data is input during a writing mode with tQSS of the minimum cycle time 0.75tCK.

First, delayed command signals transition to a predetermined level combination (e.g., a first delayed command signal CSBD, a second delayed command signal RASB and a third delayed command signal CASB go to a low level, a high level and a low level, respectively) and a time A1 after setup times of the delayed command signals is set as an input time of a write command WT_CMD. Thus, in the writing mode, data should be input at a time A3 by tQSS set to 0.75tCK.

Next, a buffer enable signal BFREN1 for enabling the data buffer receiving data is activated to a low level at a time A2 in response to a control signal CON synchronized to a rising edge of an internal clock signal ICLK. The internal clock signal ICLK is generated in sync with a rising edge of an external clock signal CLK.

However, in the scheme of data buffer control operation, as a clock cycle time is being shortened with higher frequency of the semiconductor memory, it becomes more difficult in securing a sufficient operational margin between the time A2, at which the buffer enable signal BFREN1 is activated, and the time A3 at which data is input.

SUMMARY

Accordingly, exemplary embodiments are directed to a data buffer control circuit capable of securing a sufficient operational margin between a data buffer enabling time and a data input time by advancing the data buffer enabling time.

In exemplary embodiments, a data buffer control circuit may include: an internal command signal generator configured to generate an internal command signal that is activated if delayed command signals are conditioned in a predetermined state of level combination; and a buffer enable signal generator configured to generate a buffer enable signal, which enables a data buffer receiving data in a writing mode, from the internal command signal in sync with a falling edge of an internal clock signal.

In exemplary embodiments, a semiconductor memory apparatus may include: a data buffer control circuit configured to generate an internal command signal if external command signals are input in a predetermined level combination and generate a buffer enable signal from the internal command signal in response to an internal clock signal; and a data buffer receiving data in response to the buffer enable signal during a writing mode.

A further understanding of the nature and advantages of the present invention herein may be realized by reference to the remaining portions of the specification and the attached drawings.

BRIEF DESCRIPTION OF THE DRAWINGS

The above and other aspects, features and other advantages will be more clearly understood from the following detailed description taken in conjunction with the accompanying drawings, in which.

DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present invention. Like numbers refer to like elements throughout the description of the drawings.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention.

In order to more specifically describe exemplary embodiments, various aspects will be hereinafter described in detail with reference to the attached drawings.

Figure 2:
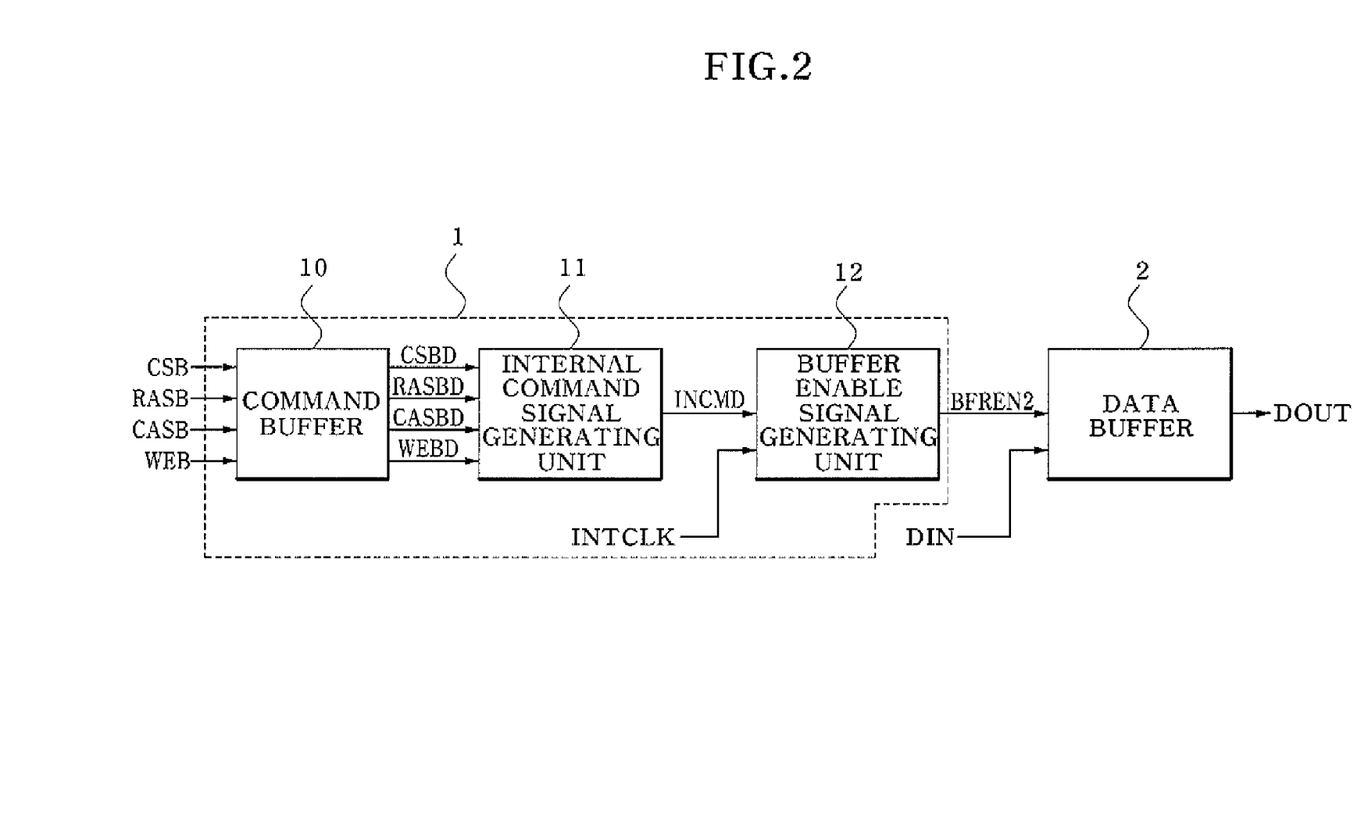
FIG. 2 is a functional block diagram of a semiconductor memory apparatus, a data buffer control circuit, according to exemplary embodiments of the present invention.

FIG. 2 illustrates a functional configuration of a semiconductor memory apparatus, including a data buffer control circuit, according to exemplary embodiments of the present invention.

Referring to FIG. 2, the semiconductor memory apparatus is comprises a data buffer control circuit 1 and a data buffer 2. The data buffer control circuit 1 includes a command buffer 10, an internal command signal generator 11 and a buffer enable signal generator 12.

The command buffer 10 is configured to generate a first delayed command signal CSBD, a second delayed command signal RASBD, a third delayed command signal CASBD and a fourth delayed command signal WEBD in response to a first command signal CSB, a second command signal RASB, a third command signal CASB and a fourth command signal WEB. The first command signal CSB functions as a chip selection signal that is activated at a low level if a chip of the semiconductor memory apparatus is selected. The second command signal RASB functions as a row address strobe signal that is activated at a low level for an active operation. The third command signal CASB functions as a column address strobe signal that is activated at a low level for a reading or writing mode. The fourth command signal WEBD functions as a write enable signal that is conditioned to be at a low level in the writing mode. The fourth command signal WEBD also functions as a read enable signal that is conditioned to be at a high level in the reading mode. The command buffer 10 may be made up with a general command buffer circuit.

Figure 3:
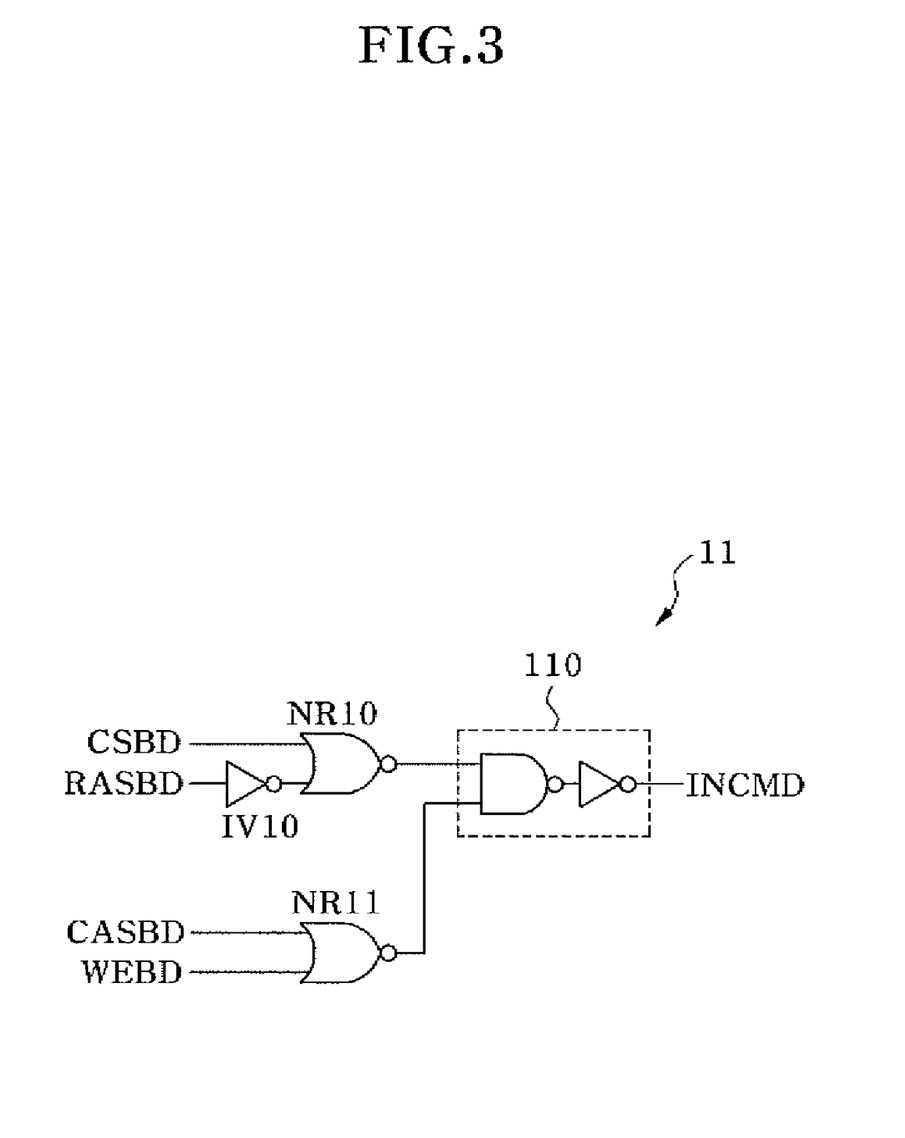
FIG. 3 is a circuit diagram illustrating the internal command signal generator of the data buffer control circuit shown in FIG. 2.

Referring to FIG. 3, the internal command signal generator 11 is exemplarily composed of a NOR gate NR10, a NOR gate NR11 and a logic circuit 110. The NOR gate NR10 is configured to execute a not-OR operation with the first delayed command signal CSBD and an inverse signal of the second delayed command signal RASBD. The NOR gate NR11 is configured to execute a not-OR operation with the third delayed command signal CASBD and the fourth delayed command signal WEBD. The logic circuit 110 is configured to execute an OR operation with output signals of the NOR gates NR10 and NR11. With this configurational structure, the internal command signal generator 11 is configured to generate an internal command signal INCMD that is activated at a high level when the first delayed command signal CSBD, the second delayed command signal RASBD, the third delayed command signal CASBD and the fourth delayed command signal WEBD are applied thereto at the respective level combination of a low level, a high level, a low level and a low level.

Figure 4:
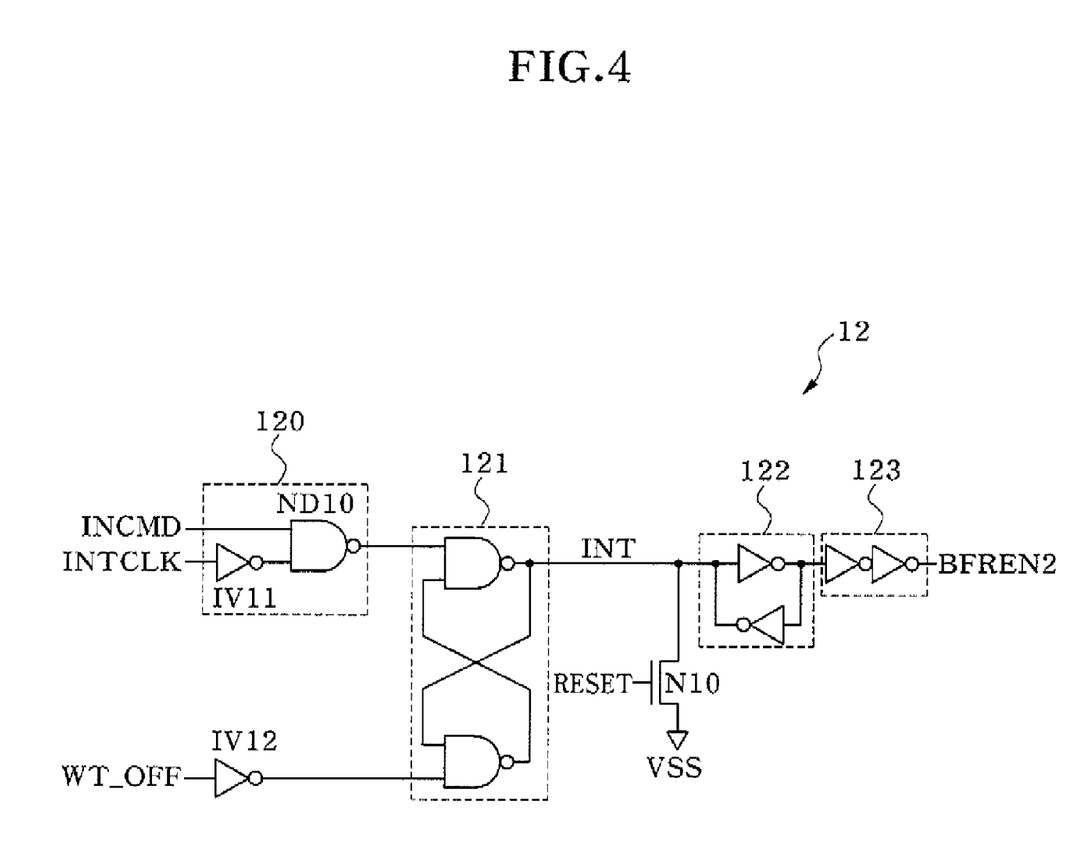
FIG. 4 is a circuit diagram illustrating the buffer enable signal generator of the data buffer control circuit shown in FIG. 2.

Referring to FIG. 4, the buffer enable signal generator 12 is exemplarily composed of a transmitter 120, a latch 121, an NMOS transistor N10, a latch 122 and a buffer 123.

The transmitter 120 is exemplarily formed by including a NAND gate ND10 for inversely buffering the internal command signal INCMD after a falling edge of an internal clock signal ICLK, i.e., after the internal clock signal ICLK transitions to a low level from a high level. In exemplary embodiments, the internal clock signal ICLK is generated in sync with a rising edge of an external clock signal CLK. The latch 121 may be configured as an SR latch that generates an internal signal INT. The internal signal INT is generated at a high level when an output signal of the NAND gate ND10 is at a low level. The internal signal INT is generated at a low level when a burst end signal WT_OFF is applied thereto at a high level. The burst end signal WT_OFF is designed to be activated as a high level after data are input by a burst length predetermined by the function of mode register set (MRS), i.e., after a burst period. The NMOS transistor N10 initializes the internal signal INT at a low level in response to a reset signal RESET. The buffer 123 generates a buffer enable signal BFREN2 from the internal signal INT.

With this configuration, the buffer enable signal generator 12 operates to generate the buffer enable signal BFREN2 which is activated at a low level in sync with a falling edge of the internal clock signal ICLK when the internal command signal INCMD applied there to at a high level. The buffer enable signal generator 12 inactivates the buffer enable signal BFREN2 to a high level when the burst end signal WT_OFF is applied thereto at a high level.

Figure 5:
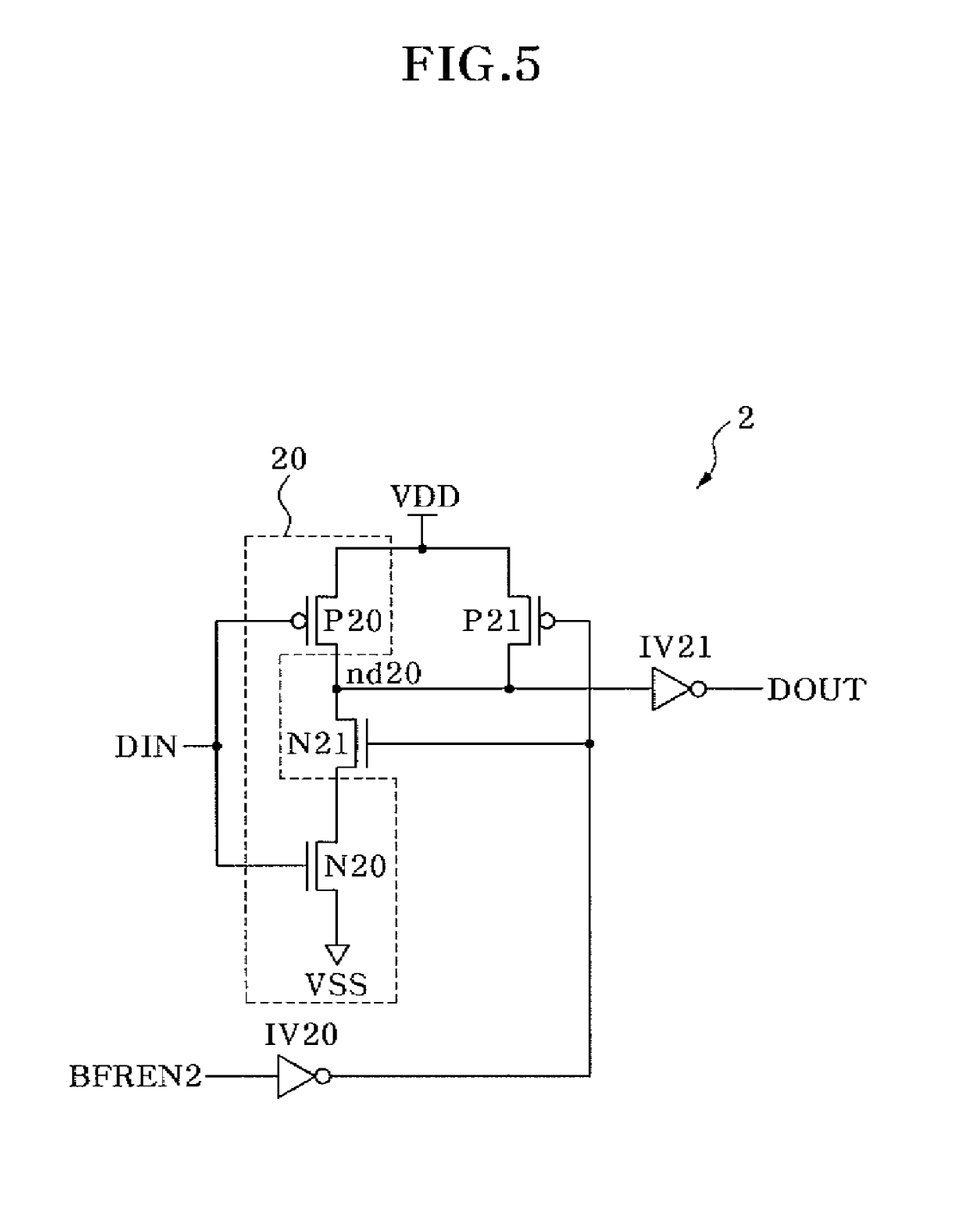
FIG. 5 is a circuit diagram illustrating the data buffer of the data buffer control circuit shown in FIG. 2.

Referring to FIG. 5, the data buffer 2 is exemplarily composed of a driver 20 and NMOS and PMOS transistors N21 and P21. The driver 20 is configured to have a PMOS transistor P20 pulling up a node nd20 and to have an NMOS transistor N20 pulling down the node nd20 in response to input data DIN. The NMOS and PMOS transistors N21 and P21 are configured to adjust a switching condition of the driver 20 in response to the buffer enable signal BFREN2. With this configuration, the data buffer 2 enables the driver 20 when the buffer enable signal BFREN2 is applied thereto at a low level, which buffers the input data DIN and which outputs the data DOUT.

Now hereinafter will be described an operation of the semiconductor memory apparatus including such a configuration of the data buffer control circuit in conjunction with FIG. 6.

Figure 6:
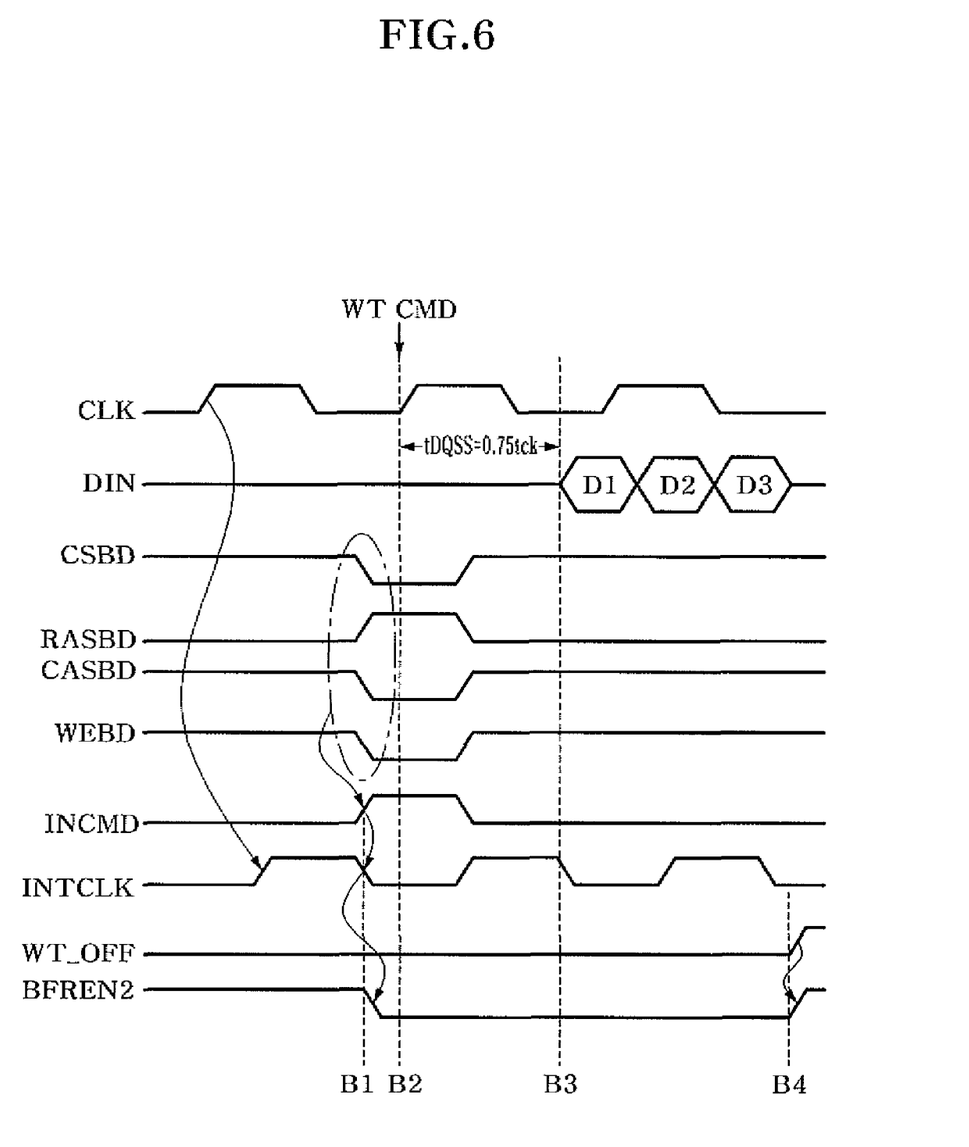
FIG. 6 is a timing diagram illustrating an operation of the data buffer control circuit shown in FIG. 2.

This data buffer control operation shown in FIG. 6 is exemplified to generate the buffer enable signal BFREN2 that enables the data buffer 2 into which data is input during the writing mode under the condition that tQSS is set to 0.75tCK as the minimum clock cycle time.

In this exemplary timing sequence of FIG. 6, an input time of a write command WT_CMD is set at a time B2 at which the first delayed command signal CSBD goes into a low level, the second delayed command signal RASBD goes into a high level, the third delayed command signal CASBD goes into a low level, and the fourth delayed command signal WEBD goes into a low level, after a setup time of the delayed command signals has been passed. Thus, in the writing mode, data must be input at a time B3 by tQSS that is set to 0.75tCK.

At the time B2, as the first delayed command signal CSBD, the second delayed command signal RASBD, the third delayed command signal CASBD and the fourth delayed command signal WEBD transition into their respective states of predetermined level combination, i.e., a low level, a high level, a low level and a low level, respectively, the internal command signal generator 11 then outputs the internal command signal INCMD that is active in a high level.

The buffer enable signal generator 12 receives the internal command signal INCMD that is activated at a high level, and outputs the buffer enable signal BFREN2 that is activated at a low level at a time B1 in sync with a falling edge of the internal clock signal ICLK.

Afterward, if the burst end signal WT_OFF is applied to the buffer enable signal generator 12 by termination of the burst period, the buffer enable signal generator 12 inactivates the buffer enable signal BFREN2 to be at a high level.

As described above, in the semiconductor memory apparatus according to exemplary embodiments, the internal command signal INCMD is activated at the time when the first delayed command signal CSBD, the second delayed command signal RASBD, the third delayed command signal CASBD and the fourth delayed command signal WEBD transition to the states of predetermined level combination, and the buffer enable signal BFREN2 is generated from the internal command signal INCMD in sync with a falling edge of the internal clock signal ICLK. Therefore, it is possible to offer a sufficient operational margin between a time of activating the buffer enable signal BFREN2 and a time of inputting data by transitioning the buffer enable signal BFREN2 to a low level at the time B1 earlier than a conventional case.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A data buffer control circuit, comprising:
   an internal command signal generator configured to generate an internal command signal that is activated when delayed command signals are conditioned into a predetermined state of level combinations; and
   a buffer enable signal generator configured to generate a buffer enable signal from the internal command signal in response to an internal clock signal and a burst end signal, wherein the buffer enable signal enables a data buffer receiving data in a writing mode, and the burst end signal is activated after a burst period.

2. The data buffer control circuit according to claim 1, wherein the internal command signal generator comprises:
   a first logic element configured to execute a logical operation with a first delayed command signal and an inverted signal of a second delayed command signal;
   a second logic element configured to execute a logical operation with third and fourth delayed command signals; and
   a logic circuit configured to execute a logical operation with output signals of the first and second logic elements.

3. The data buffer control circuit according to claim 2, wherein the first delayed command signal is made by buffering a chip selection signal, the second delayed command signal is made by buffering a row address strobe signal, the third delayed command signal is made by buffering a column address strobe signal, and the fourth delayed command signal is made by buffering a write enable signal.

4. The data buffer control circuit according to claim 1, wherein the buffer enable signal generator comprises:
   a transmitter configured to buffer and transfer the internal command signal in response to a falling edge of the internal clock signal; and
   a latch configured to generate an internal signal in response to an output signal of the transmitter and in response to and burst end signal,
   wherein the internal signal is activated in response to an output signal of the transmitter and inactivated in response to the burst end signal.

5. The data buffer control circuit according to claim 4, wherein the buffer enable signal generator comprises:
   an initializing element configured to initialize the internal signal in response to a reset signal; and
   a buffer configured to generate the buffer enable signal from an output signal of the latch.

6. A semiconductor memory apparatus comprising:
   a command buffer configured to generate the delayed command signals from external command signals;
   an internal command signal generator configured to generate an internal command signal that is activated if the delayed command signals are input in the predetermined level combination;
   a buffer enable signal generator configured to generate a buffer enable signal from the internal command signal in sync with a falling edge of an internal clock signal; and
   a data buffer receiving data in response to the buffer enable signal during a writing mode.

7. The semiconductor memory apparatus according to claim 6, wherein the internal command signal generator comprises:
   a first logic element configured to execute a logical operation with a first delayed command signal and an inverted signal of a second delayed command signal;
   a second logic element configured to execute a logical operation with third and fourth delayed command signals; and
   a logic circuit configured to execute a logical operation with output signals of the first and second logic elements.

8. The semiconductor memory apparatus according to claim 7, wherein the first delayed command signal is made by buffering a chip selection signal, the second delayed command signal is made by buffering a row address strobe signal, the third delayed command signal is made by buffering a column address strobe signal, and the fourth delayed command signal is made by buffering a write enable signal.

9. The semiconductor memory apparatus according to claim 6, wherein the buffer enable signal generator comprises:
   a transmitter configured to buffer and to transfer the internal command signal in response to a falling edge of the internal clock signal; and
   a latch configured to generate an internal signal in response to an output signal of the transmitter and in response to a burst end signal,
   wherein the internal signal is activated in response to an output signal of the transmitter and inactivated in response to the burst end signal.

10. The semiconductor memory apparatus according to claim 9, wherein the buffer enable signal generator comprises:
    an initializing element configured to initialize the internal signal in response to a reset signal; and
    a buffer configured to generate the buffer enable signal from an output signal of the latch.

11. The semiconductor memory apparatus according to claim 9, wherein the burst end signal is activated after a burst period.

12. The semiconductor memory apparatus according to claim 6, wherein the data buffer comprises:
   a driver configured to drive an output node in response to input data; and
   a drive adjusting element configured to adjust a switching condition of the driver in response to the buffer enable signal.

* * * * *